United States Patent [19]
Sugawa

[11] Patent Number: 5,401,952
[45] Date of Patent: Mar. 28, 1995

[54] SIGNAL PROCESSOR HAVING AVALANCHE PHOTODIODES

[75] Inventor: Shigetoshi Sugawa, Atsugi, Japan

[73] Assignee: Canon Kabushiki Kaisha, Tokyo, Japan

[21] Appl. No.: 964,952

[22] Filed: Oct. 22, 1992

[30] Foreign Application Priority Data
Oct. 25, 1991 [JP] Japan .................. 3-305703
Oct. 25, 1991 [JP] Japan .................. 3-305704

[51] Int. Cl.⁶ .................................................. H01J 40/14
[52] U.S. Cl. .................................. 250/208.1; 348/308
[58] Field of Search ................ 250/208.1, 214.1; 257/438, 443, 444, 168, 447; 348/308

[56] References Cited

U.S. PATENT DOCUMENTS

| | | | |
|---|---|---|---|
| 4,377,817 | 3/1983 | Nishizawa et al. | 257/447 |
| 4,835,404 | 5/1989 | Sugawa et al. | |
| 4,866,293 | 9/1989 | Nakamura et al. | |
| 4,879,470 | 11/1989 | Sugawa et al. | |
| 4,962,412 | 10/1990 | Shinohara et al. | |
| 4,972,243 | 11/1990 | Sugawa et al. | |
| 5,021,854 | 6/1991 | Huth . | |
| 5,093,704 | 3/1992 | Saito et al. | |
| 5,155,351 | 10/1992 | Yamanoto et al. | |

FOREIGN PATENT DOCUMENTS 0207826 1/1987 European Pat. Off. .
3829003 3/1989 Germany .
WO9102381 2/1991 WIPO .

OTHER PUBLICATIONS

Pat. Abs. Jp. vol. 14, No. 130, Mar. 12, 1990 & JP-A-1321707.
IEEE 1985 *Custom Int. Cir. Conf.*, May 20, 1985, pp. 112–118.

Primary Examiner—David C. Nelms
Attorney, Agent, or Firm—Fitzpatrick, Cella, Harper & Scinto

[57] ABSTRACT

An avalanche photodiode has a light receiving part capable of producing an avalanche phenomenon, a carrier storage part for storing photo signal carriers that are avalanche-multiplied in the light receiving part, and a reader for reading the photo carriers from the carrier storage part, characterized by a controller, interposed between the light receiving part and the carrier storage part, for controlling an electric field applied to the light receiving part. Also, a signal processor has a plurality of avalanche photodiodes described above, characterized by an avalanche photodiode including a shift register for driving the leader.

14 Claims, 13 Drawing Sheets

SIGNAL PROCESSOR HAVING AVALANCHE PHOTODIODES

BACKGROUND OF THE INVENTION

1. Field of the Invention

The present invention relates to a signal processor having an avalanche photodiode (hereafter abbreviated to an APD).

The APD has been increasingly developed as a photosensor for use with optical communications systems. Recently, applications in solid state image sensors have been also promoted.

Such an application is disclosed in prior art International Application No. WO91/02381 that was laid open in conformity with the Patent Cooperation Treaty.

2. Related Background Art

Solid state image sensors in particular have been developed remarkably in recent years. CCD type and MOS type solid state image sensors have already been utilized. However, the development of solid state image sensors exhibiting a much higher sensitivity and a still higher SN ratio is desired for applications to the signal processors of high-definition televisions and a wide variety of monitor cameras. Among image sensors, there is a carrier storage type avalanche multiplication solid state image sensor including an APD used as a light receiving element part that is promising in terms of having an increased SN ratio.

The carrier storage operation in the above-mentioned solid state image sensor involves the steps of setting an electrode at one terminal of the light receiving element in a floating state and reading the photo signal carriers stored therein for a constant period. When using the APD as this light receiving element, the sensitivity increases. However, voltages applied to both terminals of the APD are reduced by the storage of the photo signal carriers sufficient to change the strength of an intra-APD electric field. Concomitantly, the avalanche multiplication gain of the APD decreases. As a result, a favorable characteristic of an output signal versus the quantity of incident light i.e., the rectilinearity of the photoelectric conversion characteristic is lost.

One example of a structure proposed to obviate this problem is described on pp. 67–72, Television Association's Technological Report Vol. 11, No. 28. This solid state image sensor will be discussed with reference to FIGS. 1 and 2.

FIG. 1 is an equivalent circuit diagram of a conventional solid state image sensor. FIG. 2 is a diagram illustrating operating pulses and surface potentials in the conventional solid state image sensor.

Referring to FIG. 1, one pixel is constructed of an APD 401, a capacitor 402 and two MOS transistors 403, 404. Pulse signals G1, G2 shown in FIG. 2 are respectively applied to the MOS transistors 403, 404 from a vertical scanning circuit 405.

The operation of this image sensor will be explained with reference to the diagram showing the operating pulses and the surface potentials. To start with, as a reset operation, the same positive voltage is applied to gates of the MOS transistors 403, 404. As a result, the potentials under the gates are both reduced to a value of $V_g - V_t$. Carriers stored in the APD 401 and the capacitor 402 are swept away towards the drain. The surface potential of the APD 401 reaches a balance at $V_g - V_t$. (FIG. 2 (A)).

Next, if the MOS transistor 404 is turned OFF while applying the voltage $V_g$ to the gate of the MOS transistor 403, the APD 401 is brought into a carrier storage state while connected in parallel with the capacitor 402. Light is incident during this carrier storage period. Signal carriers that are avalanche-multiplied in the APD 401 are stored in two locations, i.e., the APD 401 and the capacitor 402. (FIG. 2 (B)).

At the end of the storage period, the MOS transistor 403 is turned OFF (FIG. 2(C)). In this state, when the positive voltage $V_g$ is applied to the gate of the MOS transistor 404, the signal carriers stored in the capacitor 402 are read as output signal carriers to an outside circuit (FIG. 2(D)). Thereafter, those operations are repeated.

In the thus constructed solid state image sensor, the electrode of the APD that assumes the floating state during the carrier storage period is connected in parallel with the capacitor. The present inventors therefore expected that variations in the voltage applied to the APD would be reduced with an increase in the capacitance of the capacitor, the changes in the gain of avalanche multiplication of the APD would be decreased, and therefore the rectilinearity of the photoelectric conversion characteristics would be improved. According to the results of a good number of tests performed by the present inventors, however, the rectilinearity was, in fact, not sufficiently ameliorated even by adding a large capacitor.

FIG. 3 shows the photoelectric conversion characteristics of the conventional solid state image sensor. As obvious from FIG. 3, the improvement in the rectilinearity is not sufficient even when adding a capacitor having a capacitance that is several 10 times as large as the junction capacitance $C_{APD}$ (18 pF in this case) of the APD. Further, the addition of such an extremely large capacitor to each pixel is not desirable in terms of improving the resolution and obtaining a hyperfine structure.

The conventional examples have been fully explained so far by exemplifying the solid state image sensor. The problem of the deterioration of the rectilinearity due to the changes in the electric field strength is common to not only the image sensor but also the avalanche photodiode and the signal processor including this avalanche photodiode.

SUMMARY OF THE INVENTION

It is a general object of the present invention, which obviates the technical problems described above, to provide an avalanche photodiode having a photoelectric conversion characteristic exhibits an excellent rectilinearity and a signal processor including the avalanche photodiode.

It is another object of the present invention to provide a high sensitivity avalanche photodiode and a signal processor including the avalanche photodiode.

It is still another object of the present invention to provide an avalanche photodiode capable of restraining fluctuations in the strength of an electric field applied to the avalanche photodiode and a signal processor including the avalanche photodiode.

To accomplish the objects of the present invention, according to one aspect of the invention, there is provided an avalanche photodiode comprising:

a light receiving part capable of producing an avalanche phenomenon; a carrier storage part for storing photo signal carriers that are avalanche-multiplied in the light receiving part; and a reading means for reading the photo carriers from the carrier storage part, characterized by a control means, interposed between the light receiving part and the carrier storage part, for controlling an electric field applied to the light receiving part.

According to another aspect of the invention, there is provided a signal processor including the avalanche photodiode.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Figure 1:
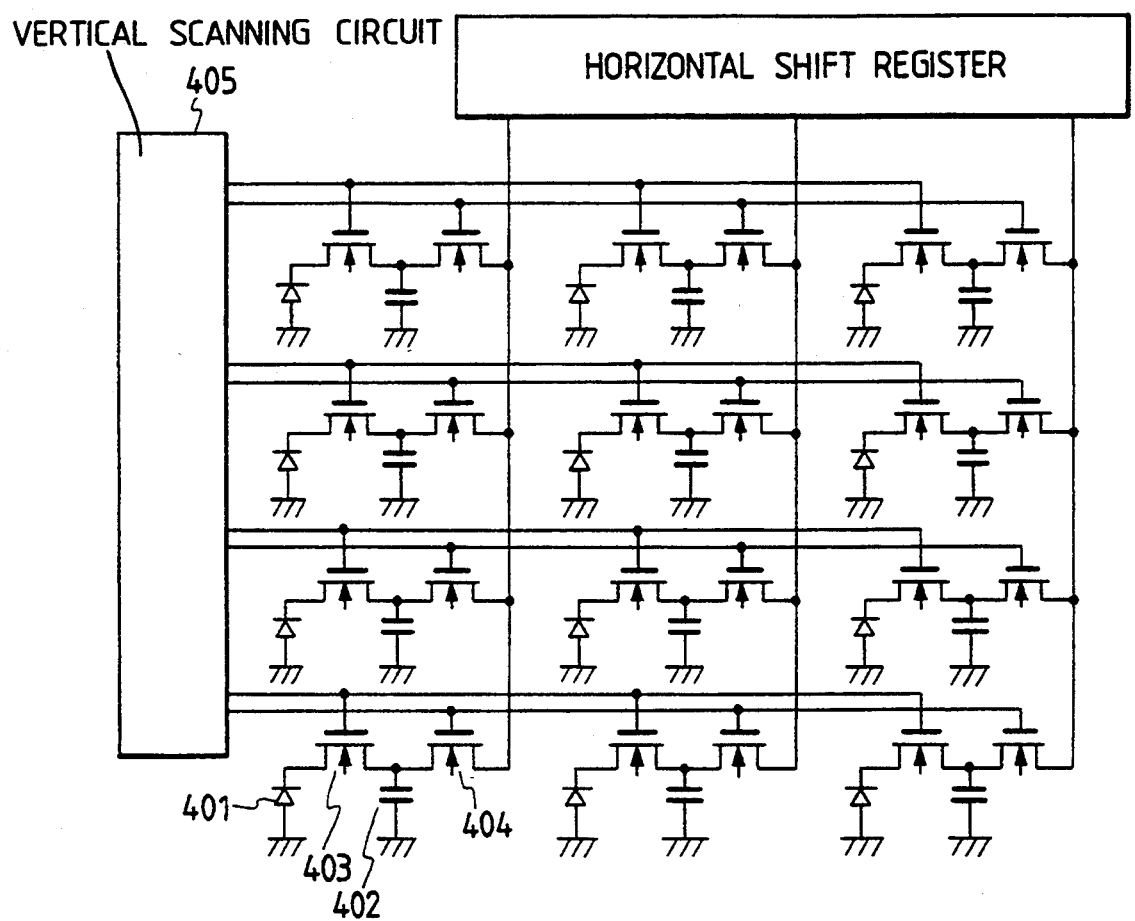
FIG. 1 is a block diagram illustrating a circuit of a solid state image sensor using a conventional avalanche photodiode.

According to the present invention, a means for controlling the strength of an electric field applied to a light receiving element part, especially to an avalanche multiplication part, is interposed between the light receiving element part incorporating an avalanche multiplying function and a carrier storage part for storing signal carriers based on the received light.

According to the present invention, the control means is capable of keeping constant the strength of the electric field applied to the avalanche multiplication part. A gain of the avalanche multiplication is thereby kept constant. In particular, when the control means is made to work during an electric field storage operating period, it is possible to obtain signals having a photoelectric converting characteristic exhibiting an excellent rectilinearity.

Namely, a potential barrier to carriers (electrons or holes) to be stored is controlled, whereby a magnitude of a potential barrier in the control means at the start of the storage operation is set larger than an initial potential of a storage part. Simultaneously, an initial potential of a cathode or an anode of the light receiving element part, i.e., the APD, is substantially equalized to a potential of the above-mentioned potential barrier.

In other words, a potential between the APD element part and the Carrier storage part is controlled so that the potential of the cathode or the anode of the APD is set different from the potential of the storage part when starting the storage; a large proportion of 10 photo generative carriers are stored in the storage part alone; and the photo generative carriers are not virtually stored in the terminal (anode or cathode), assuming a floating status, of the APD.

More preferably, a gate means serving as a reading means is provided between the carrier storage part and an output-side circuit. The above-described control means and the gate means cooperate to keep the electric field strength constant.

Further, it is desirable to provide a reset means for setting the terminal (anode or cathode), assuming the floating status, of the APD element independently at a reference potential.

This reference potential is substantially equal to the potential barrier between the light receiving element part and the carrier storage part during the carrier storage operation or slightly larger than this potential barrier enough not to cause the photo generative carriers to flow into the storage part over the potential barrier in a dark state.

[Light Receiving Element Part]

The light receiving element part may be constructed either such that a light absorption layer area for generating the carriers upon receiving the light and an avalanche multiplication layer area for effecting an avalanche multiplication are functionally separated or such that the light absorption layer area itself performs the avalanche multiplication.

In the former case, the light absorption layer may adopt a photoconductive type or a photovoltaic type capable of internally forming a depletion layer by a PN or PIN junction and a hetero or Schottky junction. Further, the avalanche multiplication layer may take any of several types, wherein ionization takes place in the junction part by effecting a backward bias of the PN or PIN junction, or the ionization takes place due to an acceleration of the carriers within a semiconductor layer by a backward bias electric field, or the ionization takes place because the carriers are accelerated due to an energy step produced in any one of a conduction band and a valence band in the hetero junction formed therein.

According to the present invention, the type exhibiting particularly advantageous effect is the "electric field acceleration type" wherein the ionization takes place due to the backward bias electric field.

Details of the light receiving element part are stated in International Application No. W091/02381 described above, the specification of patent application Ser. No. 667,400 filed on Apr. 3, 1991 in USA, titled [PHOTOELECTRIC CONVERSION APPARATUS] by a plurality of inventors including the present inventors and the specification of U.S. Pat. No. 5,093,704 granted to Saito, et al.

Then, the light receiving element part may be formed of semiconductors composed mainly of tetrahedral system elements such as silicon, germanium, carbon, etc., or IV-V group or II-VI group compound semiconductors and further semiconductors composed chiefly of chalcogenide system elements.

Concretely, the most preferable materials are single crystal or non-single crystal silicon, silicon germanium, silicon carbide, silicon germanium carbide, silicon nitride, silicon oxide, etc. and further materials containing dopant of hydrogen or halogen elements and a IV or V group. On the other hand, GaAs, GaAlAs, etc. are cited as the compound semiconductors. CdS, CdSSe, SeTe, etc. are cited as the chalcogenide system.

Those semiconductor materials are employed for constructing the APDs and for the systems which adopt the APDs. The materials are adequately selected depending on the type, etc. of the light.

[Carrier Storage Part]

The carrier storage part normally involves the use of a capacitor. To be specific, a junction capacitor using a PN junction and a junction capacitor using a MIS (Metal-Insulator-Semiconductor) junction are preferably employed.

[Control Means]

It may be satisfactory that the control means is capable of setting, to the above-mentioned set value, the initial potentials of the APD element part and the carrier storage part at the start of storage. A switch element of a transistor or the like is preferable. More preferably, a MOS gate which will be mentioned later may be cited.

[Embodiment 1]

A first embodiment of the present invention will hereafter be described with reference to the drawings.

FIGS. 4 to 7 are views illustrating a solid state image sensor in the first embodiment of the present invention.

Figure 4:
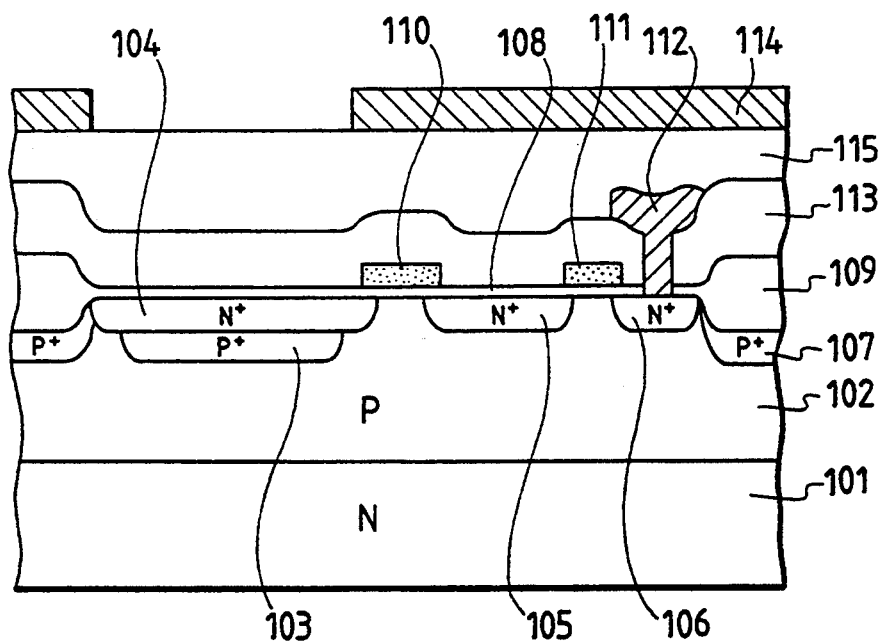
FIG. 4 is a schematic sectional view illustrating an avalanche photodiode in a first embodiment of the present invention.

FIG. 4 is a sectional view depicting one pixel of the solid state image sensor in the first embodiment of the present invention.

Referring to FIG. 4, the numeral 101 represents an N type silicon substrate; 102 a P type well (the N type silicon substrate 101 and the P type well 102 constitute a semiconductor substrate); 103 a P+ type impurity semiconductor area for forming an anode of an APD; 104 an N+ impurity semiconductor area for forming a cathode of the APD; 105 an N+ type impurity semiconductor area for forming a capacitor for storing avalanche-multiplied carriers; 106 an N+ type drain for reading a signal carrier; 107 a P+ type channel stop; 108 a gate oxide film of a MOS transistor; 109 a selective oxide area for effecting an element separation; 110 a control gate electrode for keeping constant a voltage applied to the APD; 111 a gate electrode for giving pulses to read the signal carriers stored in the N+ type impurity semiconductor area 105 for forming the storage capacitor; 112 an electrode for fetching the signal carrier; 113 an inter-layer insulating film interposed between the gate electrodes, 110, 111 and the read electrode 112; 114 an electrode for shielding portions other than the APD from the light; and 115 an inter-layer insulating film interposed between the read electrode 112 and the light shielding electrode 114.

Figure 5:
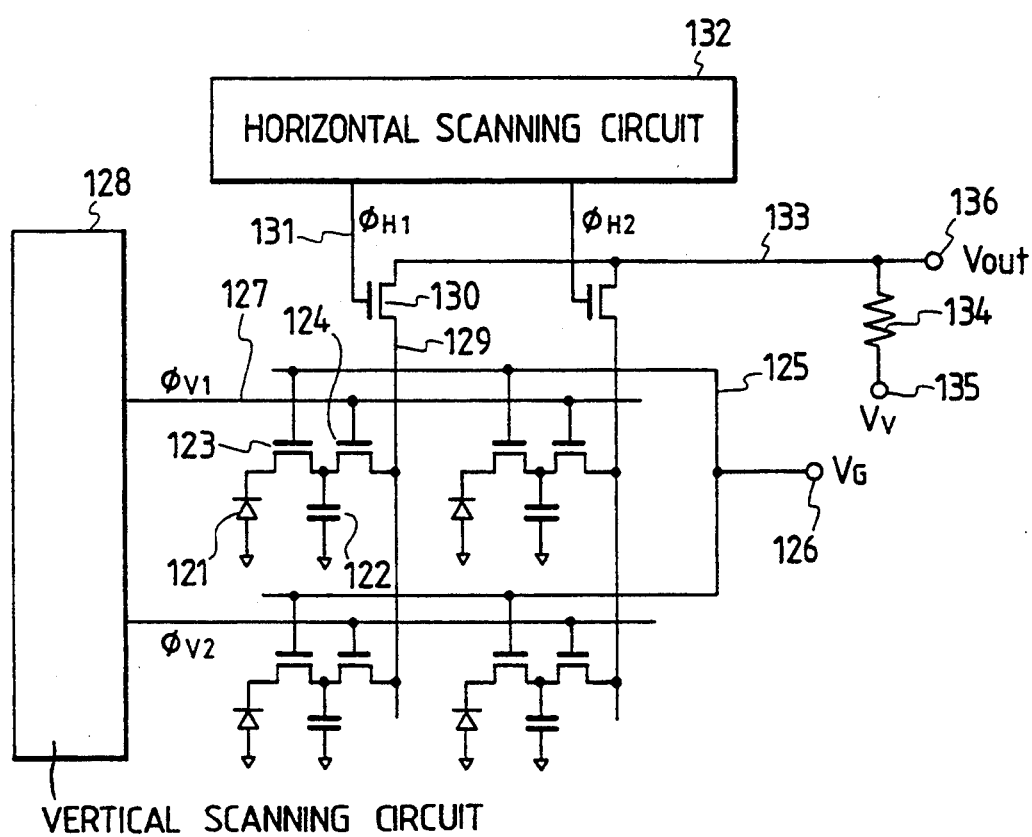
FIG. 5 is a circuit block diagram illustrating a solid state image sensor using an avalanche photodiode in the first embodiment of the present invention.

FIG. 5 is an equivalent circuit diagram of the solid state image sensor in the first embodiment of the present invention, the image sensor being constructed by the pixels that are two-dimensionally arrayed.

Referring to FIG. 5 the numeral 121 designates an APD for avalanche-multiplying photo carriers generating by photoelectrically converting the incident light; 122 a storage capacitor for storing photo signal carriers that have been avalanche-multiplied; 123 a MOS transistor for keeping constant a voltage applied to the APD 121; 124 a MOS transistor for reading the carriers stored in the storage capacitor 122; 125 a wiring for applying a control voltage $V_G$ applied to a control voltage input terminal 126 to a gate of the MOS transistor 123; 127 a wiring for applying the read pulses generated from a vertical scanning circuit 128 to a gate of the MOS transistor 124; 129 a vertical wiring for reading the photo signals stored in the storage capacitor 122; 130 a MOS switch for selecting the vertical wiring 129; 131 a wiring for applying the pulses generated from a horizontal scanning circuit 132 to the MOS switch 130; 133 a resistor for converting a photo signal current into a voltage; 135 a terminal for applying a voltage $V_V$ for setting a reset potential of the storage capacitor 122; and 136 an output terminal.

Figure 6:
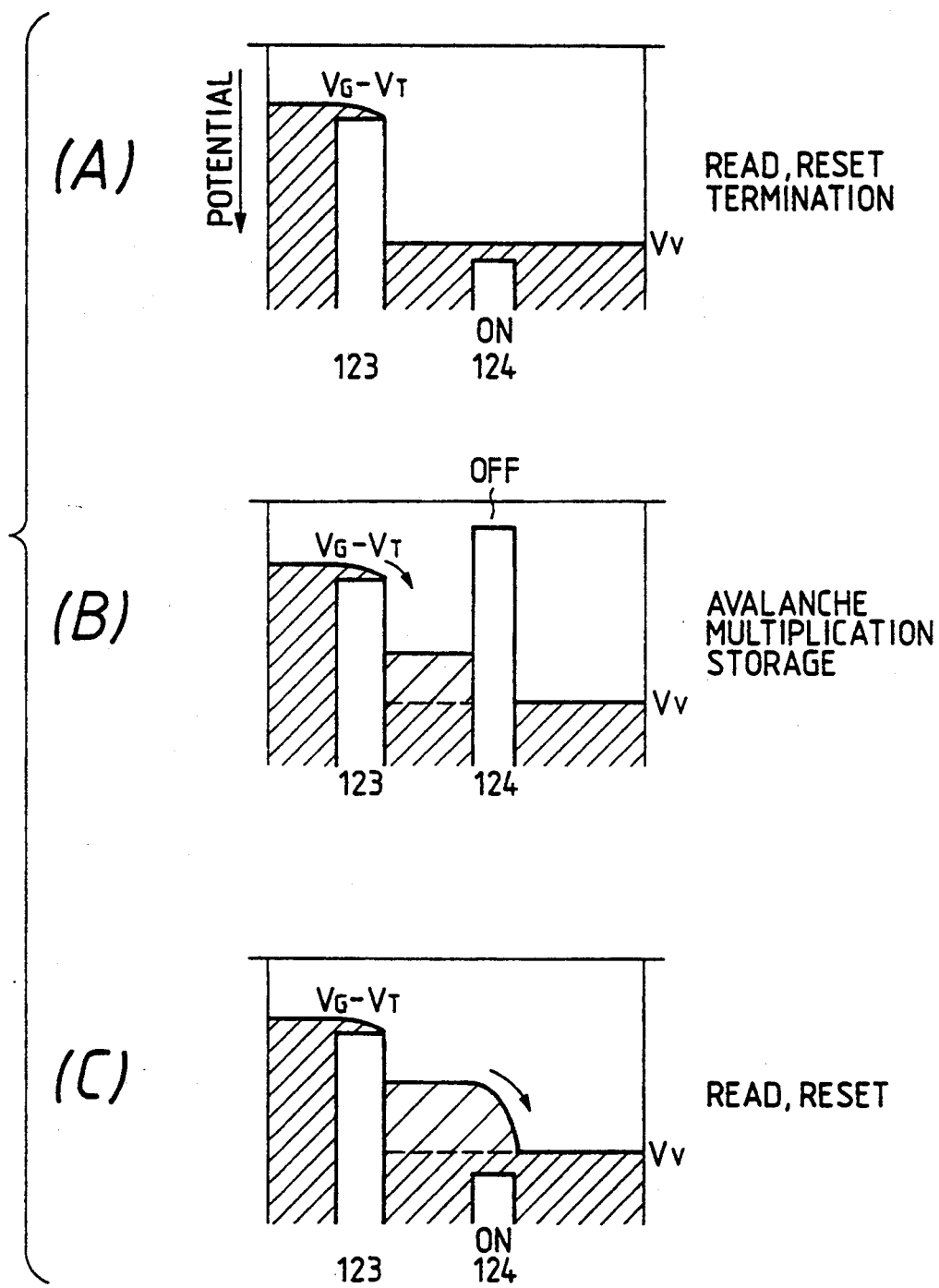
FIG. 6 is a schematic diagram of assistance in explaining the operation of the image sensor shown in FIG. 5, illustrating drive timings and potential profiles.

FIG. 6 is a view illustrating surface potentials of one pixel of the solid state image sensor in the first embodiment of the present invention. Shown in FIG. 6 are the respective surface potentials in a read/reset termination state (A) of one pixel, an avalanche multiplication storage state (B) and a read/reset state (C).

The following is an explanation of the operation of the thus constructed solid state image sensor with reference to FIGS. 4 and 6.

The N+ type silicon substrate 101 is held at 0 V. The P type well 102 for setting the potential of the P+ type impurity semiconductor area 103 of the APD 121 is held at a proper negative potential sufficient to cause the avalanche multiplication. A positive voltage $V_G$ sufficient to keep constant a channel potential ($V_G - V_T$: where $V_T$ is the threshold voltage of the MOS transistor 123) of the MOS transistor 123 is applied to the control voltage input terminal 126 (110) for setting the potential of the N+ type impurity semiconductor area 104 of the APD 121. Herein, $V_G - V_T$ is set at a positive potential at least during the storage operation, while $V_G$ is set at a potential that is larger in the positive direction than an OFF voltage of the transistor 124. Applied to the terminal 135 is a proper positive potential higher than $V_G$ sufficient to keep the MOS transistor 123 invariably in an ON state and to read/reset the photo signal from the storage capacitor 122. In the thus set state, a potential of a channel area under the gate of the MOS transistor 123 and a potential of the N+ type impurity semiconductor area 104 of the APD 121 are held to a constant value of $V_G - V_T$.

To start with, pulses $O_{V1}$, $O_{V2}$ generated from the vertical scanning circuit 128 are applied to the gate of the MOS transistor 124 till the read/reset operations are completed. The MOS transistor 124 assumes the ON state, while the potential of the storage capacitor 122 is set at the voltage $V_V$ ((A) in FIG. 6) higher than $V_G - V_T$.

Next, the MOS transistor 124 is turned OFF to enter an avalanche multiplication storage period. At this moment, the light incident on the APD area undergoes a photoelectric conversion. The holes reach the P+ type impurity semiconductor area 103 and the P type well area 102 and are absorbed therein. The electrons are multiplied in the vicinity of the junction part between the P+ type impurity semiconductor area 103 and the N+ type impurity semiconductor area 104 that are defined as avalanche areas. The electrons are stored in the storage capacitor 122 after passing through the N+ type impurity semiconductor area 104 and the channel area under the gate of the MOS transistor 123. At this time, the potential of the APD area is kept invariably constant by the MOS transistor 123. The photo carriers that have been generated and multiplied are immediately led to the storage capacitor 122 without being stored in the N+ type impurity semiconductor area 104. Hence, a gain of the avalanche multiplication does not change ((B) of FIG. 6).

Next, the pulse is applied to the wiring 127 from the vertical scanning circuit 128 during a horizontal blanking period. The MOS transistor 124 is turned ON, and the avalanche-multiplied signal carriers stored in the storage capacitor 122 are read to the vertical wiring 129 ((C) of FIG. 6). Thereafter, a horizontal scan pulse is applied from the horizontal scanning circuit 132 during a horizontal scan period. Signal currents are, after making the MOS switch 130 conductive, sequentially outputted from the output terminal 136 while being subjected to a voltage conversion by a resistor 134.

Figure 7:
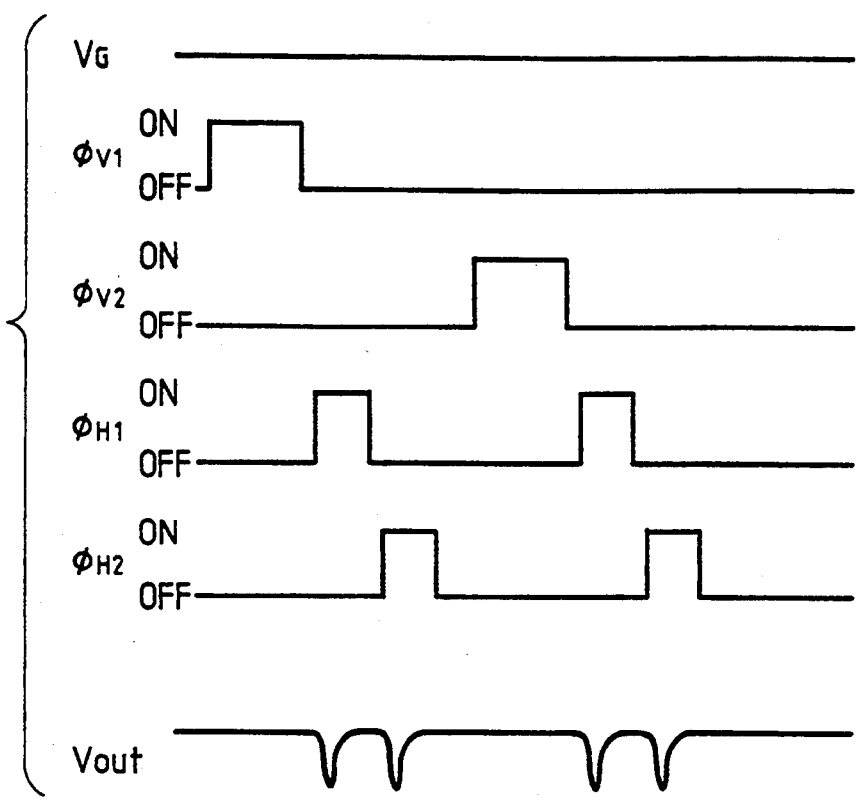
FIG. 7 is a timing chart of assistance in explaining one example of the operation of the image sensor depicted in FIG. 5.
Figure 8:
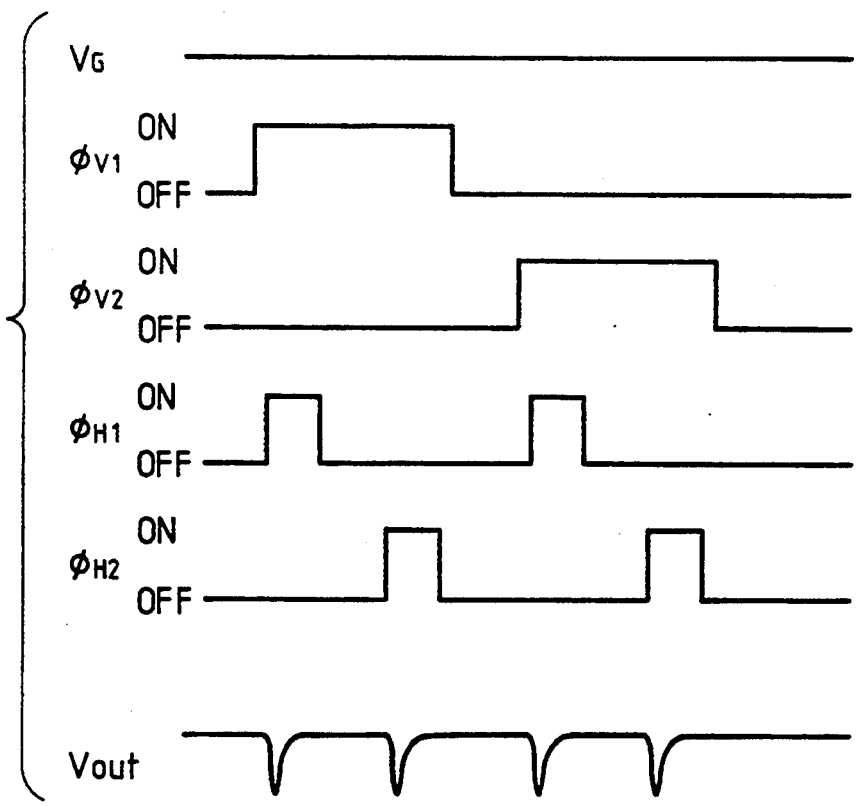
FIG. 8 is a timing chart of assistance in explaining another example of the operation of the image sensor shown in FIG. 5.

FIGS. 7 and 8 are timing charts of assistance in explaining two examples of the operation of the solid state image sensor depicted in FIG. 4.

In the example of FIG. 8, the signal of the storage part is not temporarily read to the vertical line but outputted by simultaneously turning ON the MOS transistors 124,130.

Figure 9:
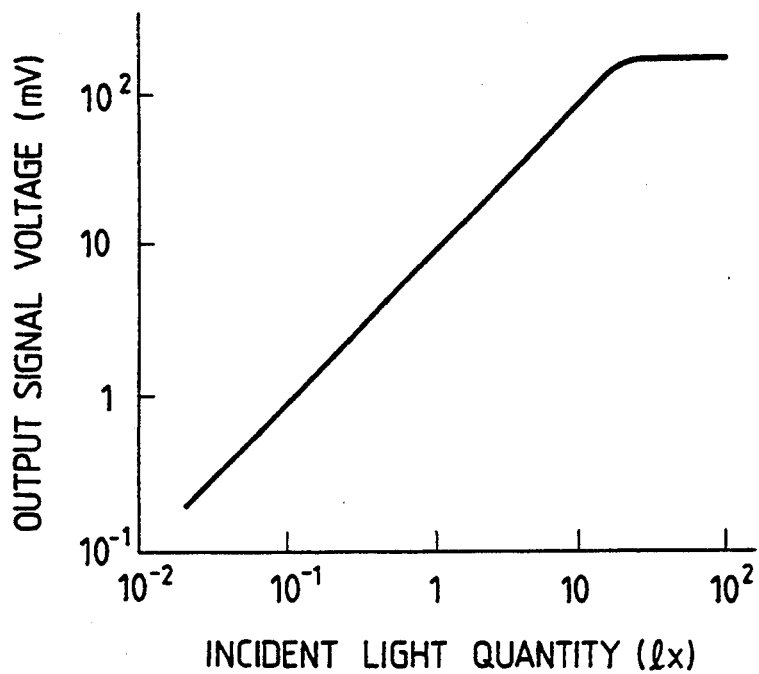
FIG. 9 is a diagram showing a photoelectric conversion characteristic of the solid state image sensor in the first embodiment.

FIG. 9 shows a photoelectric conversion characteristic of the solid state image sensor in this embodiment constructed in the way described above. In accordance with the embodiment of this invention, the gain of the avalanche multiplication is set to 20. As obvious from FIG. 9, a good rectilinearity of the photoelectric conversion characteristic is obtained.

[Embodiment 2]

Next, a second embodiment of the present invention will be demonstrated with reference to the drawings.

Figure 10:
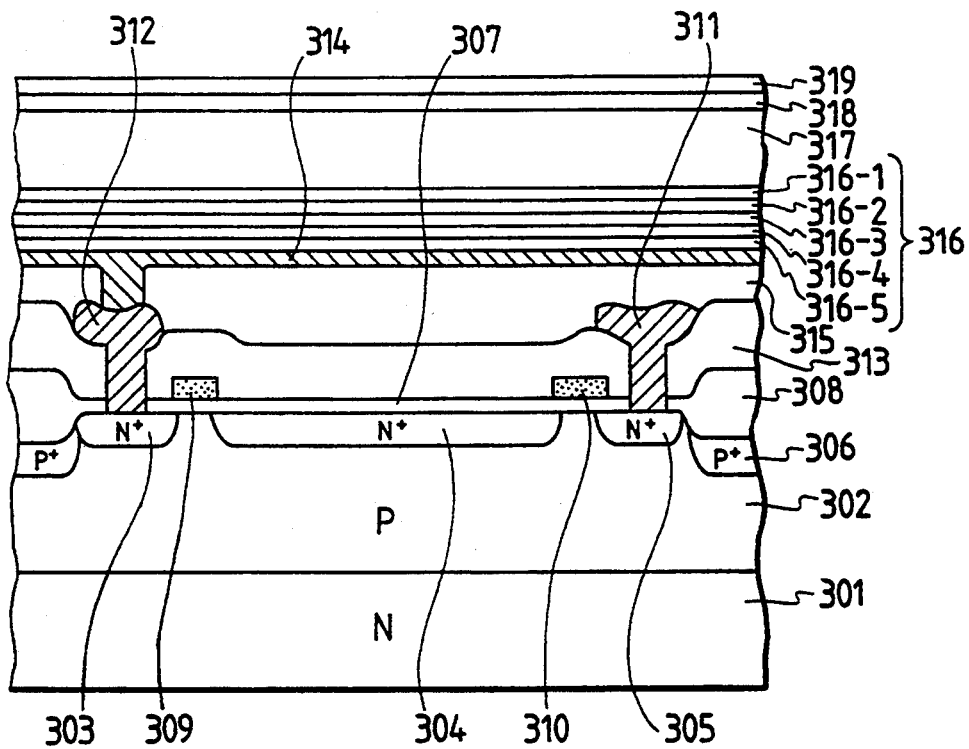
FIG. 10 is a schematic sectional view illustrating an avalanche photodiode in a second embodiment of the present invention.

FIG. 10 is a sectional view of one pixel of the solid state image sensor in the second embodiment of this invention.

Turning to FIG. 10, the numeral 301 denotes an N type silicon substrate; 302 a P type well; 303 an N+ type impurity semiconductor area for forming an APD; 304 an N+ type impurity semiconductor area for forming a capacitor for storing avalanche-multiplied carriers; 305 an N+ type drain for reading a signal carrier; 306 a P+ type channel stop; 307 a gate oxide film of a MOS transistor; 308 a selective oxide area for effecting an element separation; 309 a control gate electrode for keeping constant a voltage applied to the APD; 310 a gate electrode for giving pulses for reading the signal carriers stored in the N+ type impurity semiconductor area 304 for forming the storage capacitor; 311 an electrode for fetching the signal carrier; 312 an electrode for leading the avalanche-multiplied signal carrier to the N+ type impurity semiconductor area 303; 313 an inter-layer insulating film interposed between the gate electrodes 309,310 and the electrodes 311, 312; 314 a pixel electrode provided per pixel; 315 an inter-layer insulating film interposed between the electrodes 311, 312 and the electrode 314; 316 an avalanche multiplication area constructed to sequentially laminate five layers 316-1, 316-2, 316-3, 316-4, 316-5 that are modulated to augment a band gap from a layer-upward direction to a layer-downward direction by changing a composition ratio of germanium and carbon from amorphous silicon germanium to amorphous silicon carbide; 317 a light receiving layer, composed of an I type amorphous silicon, for leading the carriers generated by photoelectrically converting the incident light to the avalanche multiplication area 316; 318 a P+ type amorphous silicon layer; and 319 a transparent electrode.

Figure 2:
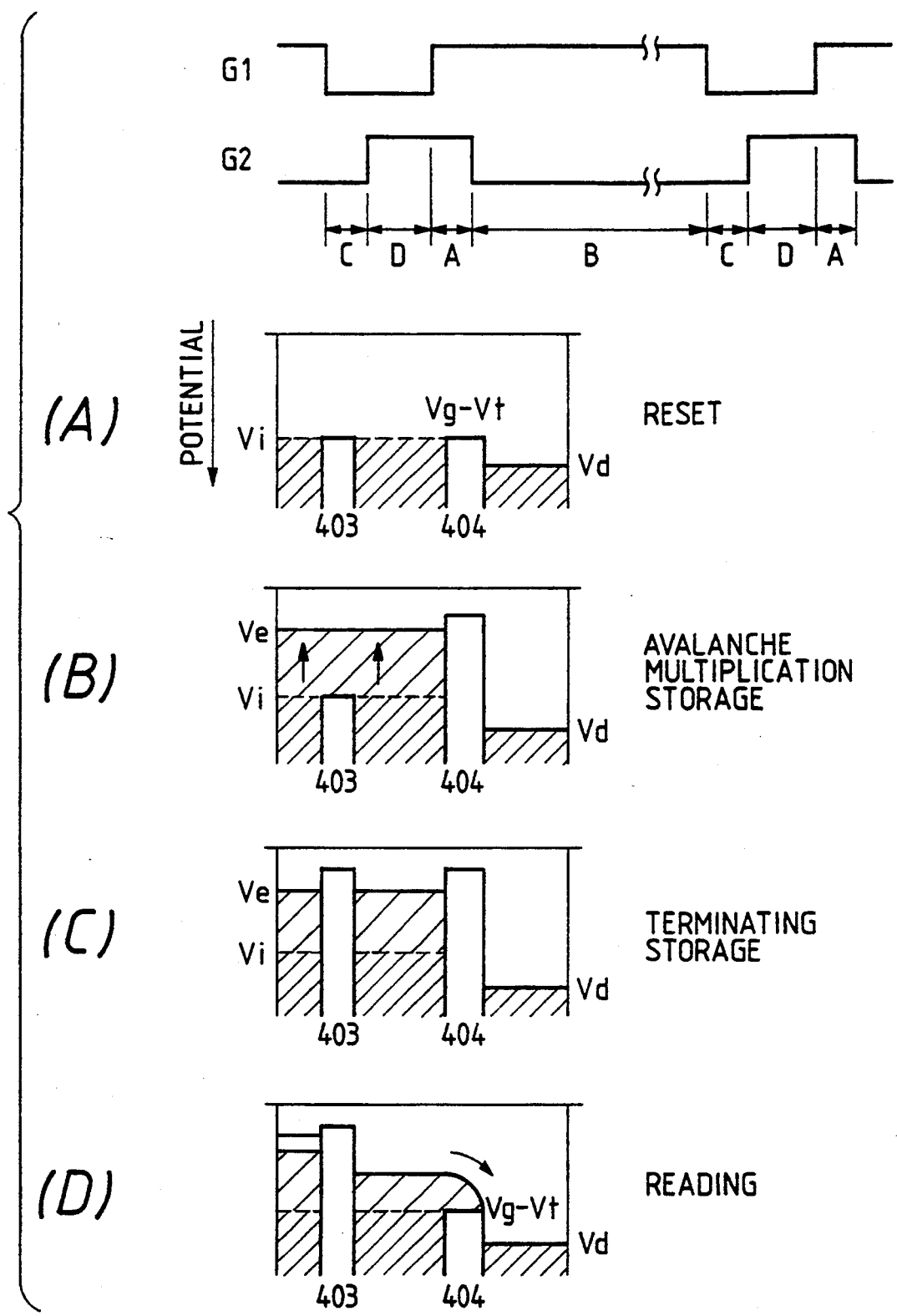
FIG. 2 is a schematic diagram of assistance in explaining the operation of the image sensor shown in FIG. 1, illustrating drive timings and potential profiles.
Figure 3:
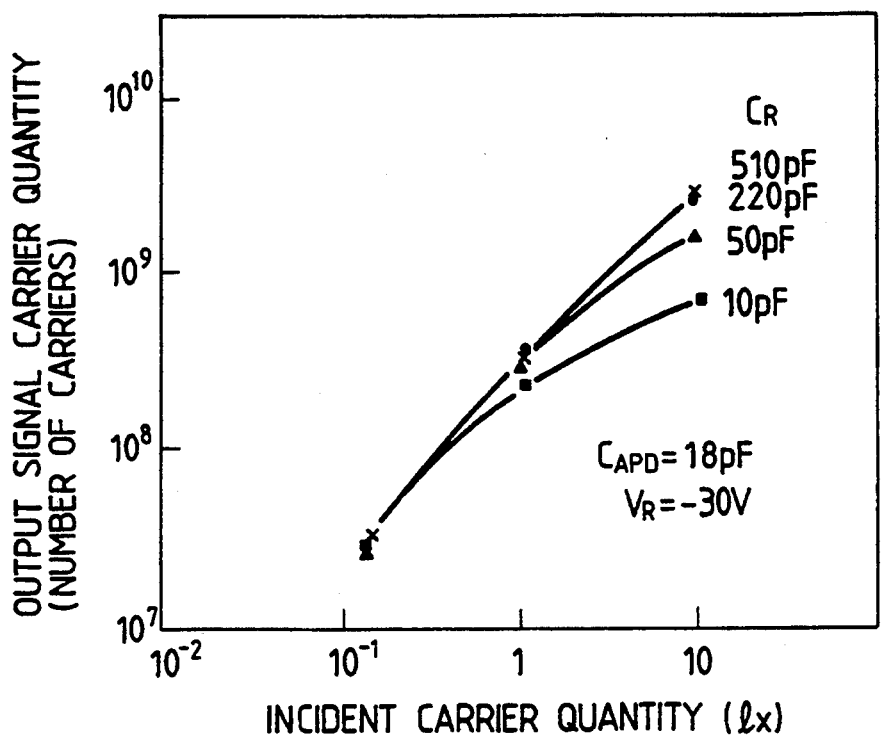
FIG. 3 is a graphic chart showing a photoelectric conversion characteristic of the image sensor depicted in FIG. 1.

In the solid state image sensor in accordance with this embodiment, as in the same way with the first embodiment shown in FIG. 2, the pixels are two-dimensionally arrayed and operated.

The operation of the solid state image sensor in this embodiment will hereafter be explained.

The N type silicon substrate 301 is held at 0 V. The P type well 302 is held at a proper negative potential to permit a normal operation of the MOS transistor. The transparent electrode 319 is held at a proper negative potential sufficient to cause the avalanche multiplication. A proper positive voltage $V_G$ sufficient to keep constant a channel potential under the control gate electrode 309 is applied to the control gate electrode 309 for setting a potential of the N+ type impurity semiconductor area 303. Applied to the gate electrode 310 is a proper positive voltage higher than $V_G$ sufficient to keep the MOS transistor 123 invariably in the ON state and the read/reset the photo signal from the storage capacitor. In the thus set state, the potential of the channel area under the gate of the control gate electrode 309 and the potential of the N+ type impurity semiconductor area 303 are held to a constant value of $V_G - V_T$.

The read/reset operations are performed in the same manner with the first embodiment shown in FIG. 6 (A).

During the next avalanche multiplication storage period, the incident light undergoes a photoelectric conversion through the light receiving layer 317. The holes reach the P+ type amorphous silicon layer 318 and are absorbed therein. The electrons are multiplied in the avalanche multiplication area 316. The electrons are, after passing through the N+ type impurity semiconductor area 303 and the channel area under the control gate electrode 309, stored in the N+ type impurity semiconductor area 304 for forming the storage capacitor. A potential of the amorphous layers laminated at this moment is always kept constant. The photo carriers which have been generated and multiplied are immediately led to the N+ type impurity semiconductor area 304 of the storage capacitor without being stored in the N+ type impurity semiconductor area 303. Hence, the gain of the avalanche multiplication does not change. The avalanche-multiplied signal carriers stored in the N+ type impurity semiconductor area 304 are outputted through the electrode 311 in the same way with as the first embodiment shown in FIG. 4.

The photoelectric conversion characteristic of the solid state image sensor in the thus constructed present embodiment also exhibits a good rectilinearity as similar to the characteristic diagram of FIG. 9 of the first embodiment. Further, in accordance with this embodiment, the light receiving part and the avalanche multiplication part are formed in lamination. Therefore, an allowance is provided in terms of area, and a capacitance value of the storage capacitor can be set large. A dynamic range is wider than the one shown in FIG. 4.

Note that the present invention is not limited to the embodiments 1 and 2 discussed above. For instance, the potential control means may be a field-effect transistor. Instead of the MOS transistor, a junction type field-effect transistor (JFET) and a static induction transistor (SIT) may be usable. The storage capacitor may involve the use of a MOS capacitor in place of the PN junction. The pixel switch for reading the signal carrier from the storage capacitor may involve the use of a bipolar transistor and the JFET as a substitute for the MOS transistor. Current reading may be available as a reading method in place of voltage reading. The pixels may be arrayed one-dimensionally instead of the two-dimensional array. The present invention may be embodied otherwise in many variant forms without departing from the scope of the invention.

As fully discussed above, in accordance with the embodiments 1 and 2, the potential control means interposed between the light receiving part and the carrier storage part is capable of keeping constant the potential applied to the APD. The gain of the avalanche multiplication of the APD can be kept constant also during the carrier storage period. Hence, it is possible to obtain the solid state image sensor exhibiting an excellent rectilinearity of the photoelectric conversion characteristic, a high sensitivity and a high SN ratio.

A solid state image sensor in an embodiment which will be described hereinbelow comprises: a light receiving part consisting of an APD; a carrier storage part for storing photo signal carriers multiplied in this light receiving part; and a reading means for reading the photo signal carrier from this carrier storage part. The solid state image sensor further includes: a potential control means for controlling a potential applied to the APD at least during a storage period is interposed between the light receiving part and the carrier storage part; and a potential fixing means for fixing the potential for a constant period.

Based on the construction described above, the potential applied to the APD can be kept substantially constant without producing any residual image owing to the potential control means interposed between the light receiving part and the carrier storage part and the potential fixing means for fixing the potential of the APD for the constant period. During the carrier storage period also, the gain of the avalanche multiplication of the APD can be kept constant. Hence, it is feasible to prevent the rectilinearity of the photoelectric conversion characteristic from being deteriorating, as caused in the conventional APD carrier storage type solid state image sensor, due to variations in the voltage applied to the APD.

[Embodiment 3]

Figure 11:
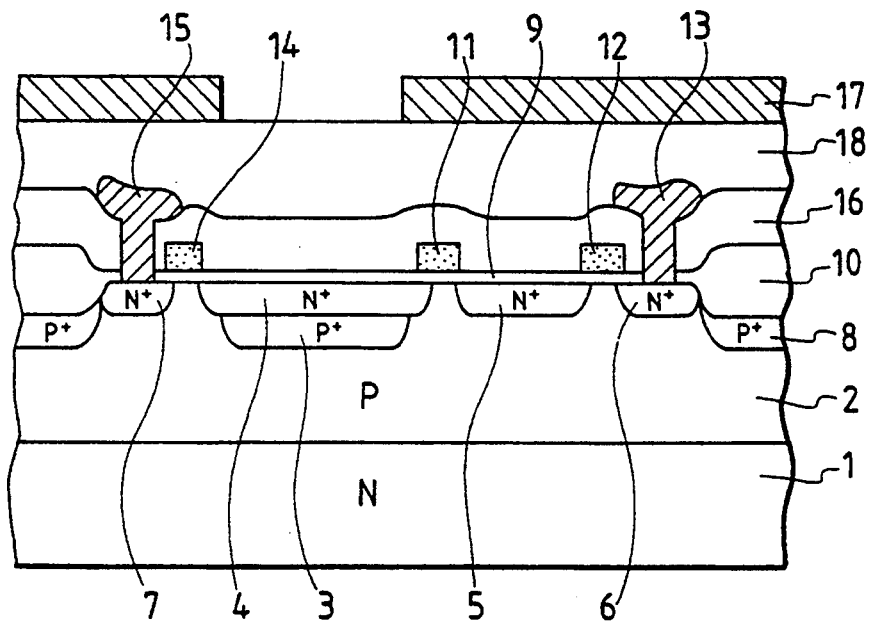
FIG. 11 is a schematic sectional view illustrating an avalanche photodiode in a third embodiment of the present invention.
Figure 12:
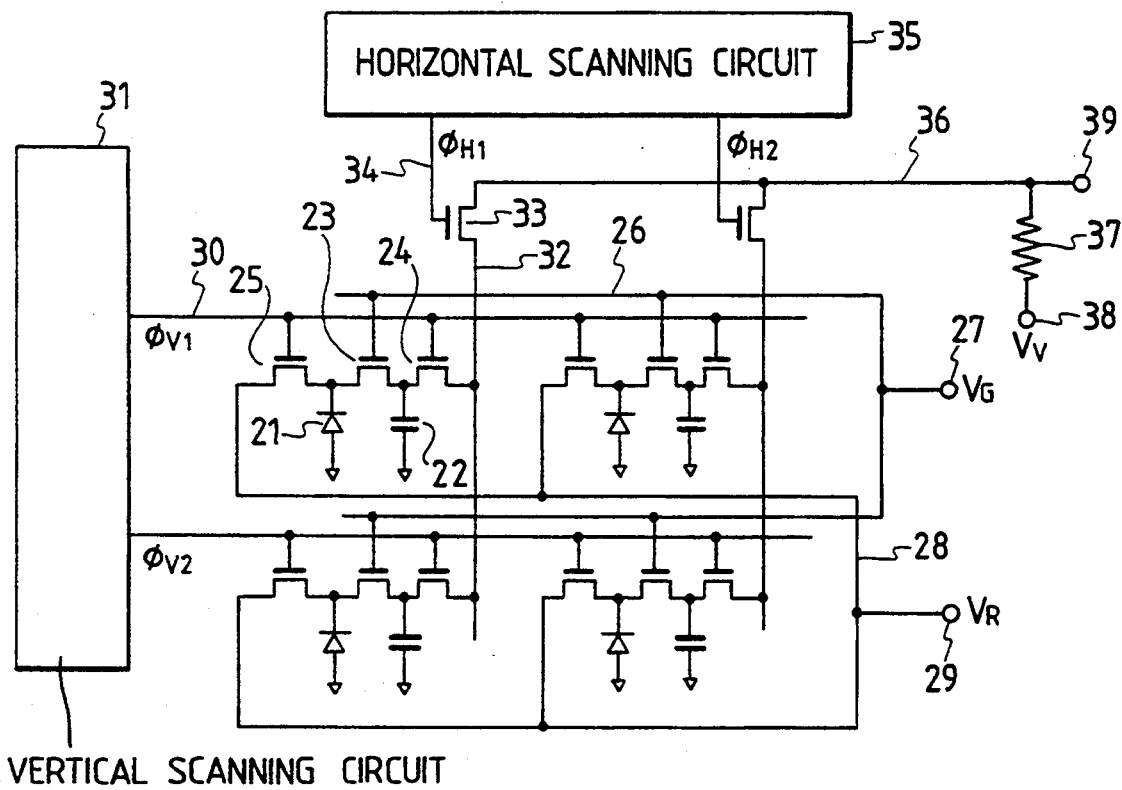
FIG. 12 is a block diagram illustrating a circuit of the solid state image sensor using the avalanche photodiode in the third embodiment of the present invention.
Figure 13:
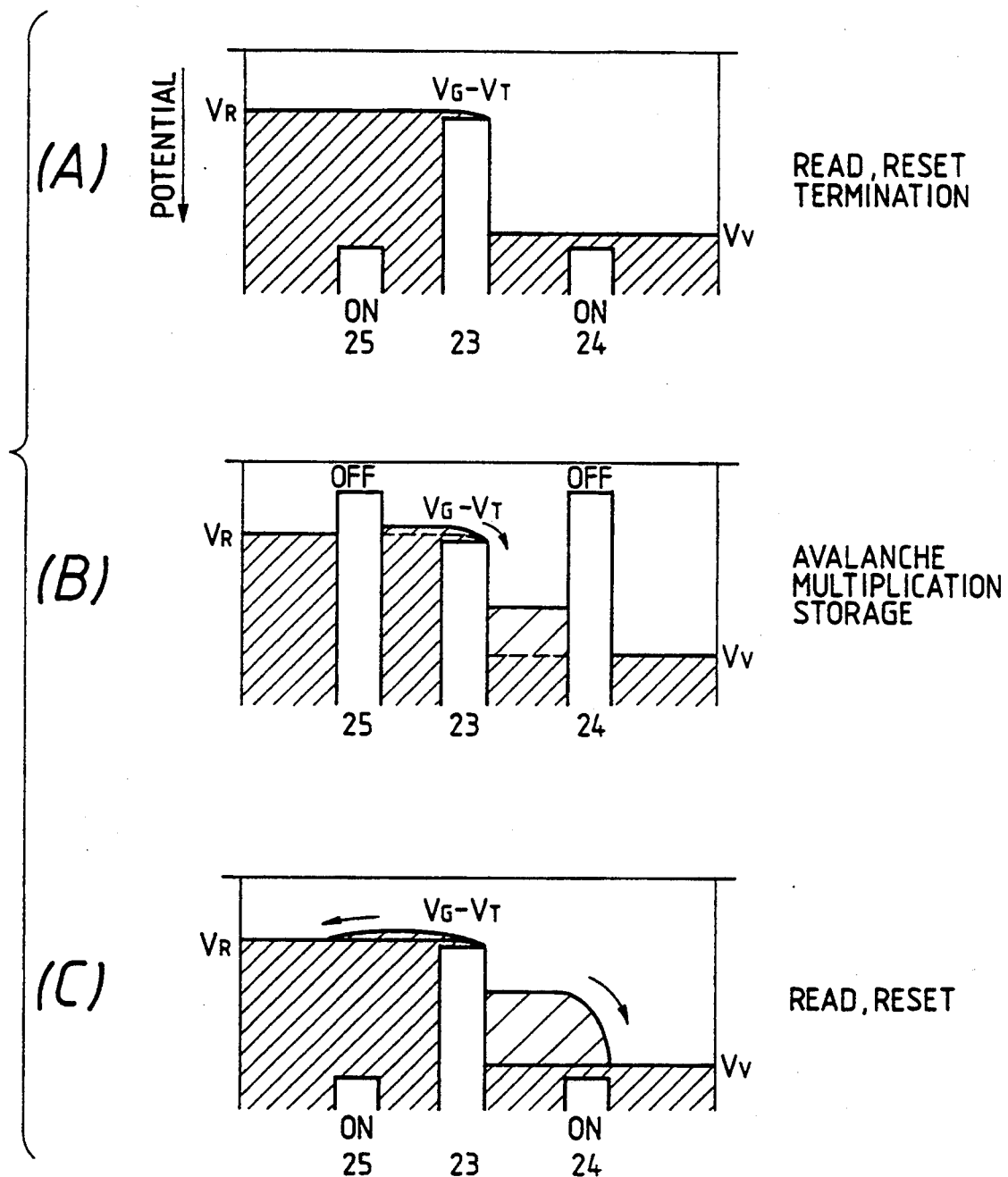
FIG. 13 is a schematic diagram of assistance in explaining the operation of the image sensor shown in FIG. 12, illustrating drive timings and potential profiles.

FIGS. 11 through 13 are views illustrating a solid state image sensor in a third embodiment of the present invention.

FIG. 11 is a sectional view depicting one pixel of the solid state image sensor in the third embodiment of this invention.

Referring to FIG. 11, the numeral 1 represents an N type silicon substrate; 2 a P type well (N type silicon substrate 1 and the P type well 2 constitute a semiconductor substrate); 3 a P+ type impurity semiconductor area for forming an APD; 4 an N+ impurity semiconductor area for forming the APD; 5 an N+ type impurity semiconductor area for forming a capacitor for storing avalanche-multiplied carriers; 6 an N+ type drain for reading a signal carrier; 7 an N+ type drain for giving a voltage for fixing a potential of the N+ type impurity semiconductor area of the APD for a constant period; 8 a P+ type channel stop; 9 a gate oxide film of a MOS transistor; 10 a selective oxide area for effecting an element separation; 11 a control gate electrode for keeping constant a voltage applied to the APD; 12 a gate electrode for giving pulses to read the signal carriers stored in the N+ type impurity semiconductor area 5 for forming the storage capacitor; 13 an electrode for fetching the signal carrier; 14 a gate electrode for giving a pulse for fixing the potential of the N+ type impurity semiconductor area 4 of the APD; 15 an electrode to which a fixed voltage $V_R$ is applied; 16 an inter-layer insulating film interposed between the gate electrodes 11, 12 and the electrodes 13, 15; 17 an electrode for shielding portions from the light other than the APD which undergoes an incidence of light; and 18 an inter-layer insulating film interposed between the electrodes 13, 15 and the light shielding electrode 17.

FIG. 12 is an equivalent circuit diagram of the solid state image sensor in the embodiment 3 of the present invention, the image sensor being constructed by the pixels that are two-dimensionally arrayed.

Referring to FIG. 12, the numeral 21 designates an APD for avalanche-multiplying photo carriers generated by photoelectrically converting the incident light; 22 a storage capacitor for storing photo signal carriers that have been avalanche-multiplied; 23 a MOS transistor for keeping constant a voltage applied to the APD 21; 24 a MOS transistor for reading the carriers stored in the storage capacitor 22; 25 a MOS transistor for fixing a voltage applied to the APD 21 for a constant period; 26 a wiring for applying a control voltage $V_G$ applied to a control voltage input terminal 27 to a gate of the MOS transistor 23; 28 a wiring for leading the voltage $V_R$ applied to a fixed voltage input terminal 29 to the N+ type drain 7 of the MOS transistor 25; 30 a wiring for applying the read pulses generated from a vertical scanning circuit 31 to gates of the MOS transistors 24 and 25; 32 a vertical wiring for reading the photo signals stored in the storage capacitor 22; 23 a MOS switch for selecting the vertical wiring 32; 34 a wiring for applying the pulses generated from a horizontal scanning circuit 35 to the MOS switch 33; 36 a horizontal read wiring; 37 a resistor for converting a photo signal current into a voltage; 38 a terminal for applying a voltage $V_V$ for setting a reset potential of the storage capacitor 22; and 39 an output terminal.

FIG. 13 is a view illustrating surface potentials of one pixel of the solid state image sensor in the embodiment 3 of the present invention. Shown in FIG. 13 are the respective surface potentials in a read/reset termination (A) of one pixel, an avalanche multiplication storage (B) and a read/reset (c).

The following is an explanation of the operation of the thus constructed solid state image sensor with reference to FIGS. 11, 12 and 13.

The N+ type silicon substrate 1 is held at 0 V. The P type well 2 for setting the potential of the P+ type impurity semiconductor area 3 of the APD 21 is held at a proper negative potential sufficient to cause the avalanche multiplication. A proper positive voltage $V_G$ sufficient to keep constant a channel potential of the MOS transistor 23 is applied to the control voltage input terminal 27 for controlling the potential of the N+ type impurity semiconductor area 4 of the APD 21. The fixed voltage input terminal 29 is held at a positive potential $V_R$. The terminal 38 is held at a proper positive voltage $V_V$ higher than $V_G$ sufficient to set the MOS transistor 23 invariably in the ON state and to read/reset the photo signal from the storage capacitor 22.

To begin with, the pulses generated from the vertical scanning circuit 31 are applied to the gates of the MOS transistors 24, 25 just when the read/reset operations are completed. The MOS transistors 24, 25 assume the ON state, while the potential of the storage capacitor 22 is set at the voltage $V_V$ higher than $V_G-V_T$. Further, a potential of the N+ type impurity semiconductor area 4 of the APD 21 is set at a voltage $V_R$ substantially equal to or slightly higher than the channel potential $V_G-V_T$ of the MOS transistor 23.

Next, the MOS transistors 24, 25 are turned OFF to enter an avalanche multiplication storage period. At this moment, the light incident on the APD area undergoes a photoelectric conversion. The holes reach the P+ type impurity semiconductor area 3 and the P type well area 2 and are absorbed therein. The electrons are multiplied in the vicinity of the junction part between the P+ type impurity semiconductor area 3 and the N+ type impurity semiconductor area 4 that are defined as avalanche areas. The electrons are stored in the storage capacitor 22 after passing through the N+ type impurity semiconductor area 4 and the channel area under the gate of the MOS transistor 23. At this time, the potential of the APD area is kept substantially constant by the MOS transistor 23. The photo carriers that have been generated and multiplied are led to the storage capacitor 22 without being substantially stored in the N+ type impurity semiconductor area 4. Hence, a gain of the avalanche multiplication does not change.

Observing it more precisely, however, the extra photo carriers, though very small in quantity, exist in the N+ type impurity semiconductor area 4 in a light irradiating state as compared with a carrier quantity in the N+ type impurity semiconductor area 4 in the dark state. The quantity of photo carriers existing in this N+ type impurity semiconductor area 4 slightly varies depending on the incident light quantity. Hence, the potential of the N+ type impurity semiconductor area 4 also fluctuates slightly from the potential prescribed by the gate control electrode in the dark state. An influence of the photo carriers existing during this light irradiation does not cause a variation in the applied voltage sufficient to change the gain of avalanche multiplication of the APD. If the influence remains as it is, however, the residual image appears. For this reason, there is performed an operation to discharge the extra carriers as will be shown hereinbelow in the fixed potential, thereby preventing the occurrence of the residual image (FIG. 13(B)).

Next, the pulse is applied to the wiring 30 from the vertical scanning circuit 31 during a horizontal blanking period. The MOS transistor 24 is turned ON, and the avalanche-multiplied signal carriers stored in the storage capacitor 22 are read to the vertical wiring 32. At this time, the MOS transistor 25 is simultaneously turned ON. With the light irradiation, the extra photo carriers existing in the N+ type impurity semiconductor area 4 are discharged through the N+ type drain 7. The potential of the N+ type impurity semiconductor area 4 is fixed to the voltage $V_R$. This voltage fixing operation is executed per field, and hence the previous avalanche multiplication storage operation is always started from the same APD application voltage. Consequently, no residual image is produced (FIG. 13 (C)). Thereafter, a horizontal scan pulse is applied from the horizontal scanning circuit 35 during a horizontal scan period. Signal currents are, after making the MOS switch 33 conductive, sequentially outputted from the output terminal 139 while being subjected to a voltage conversion by a resistor 37.

Driving is effected based on the timing charts of FIGS. 7 and 8 as in the same way with the embodiments discussed above.

Figure 14:
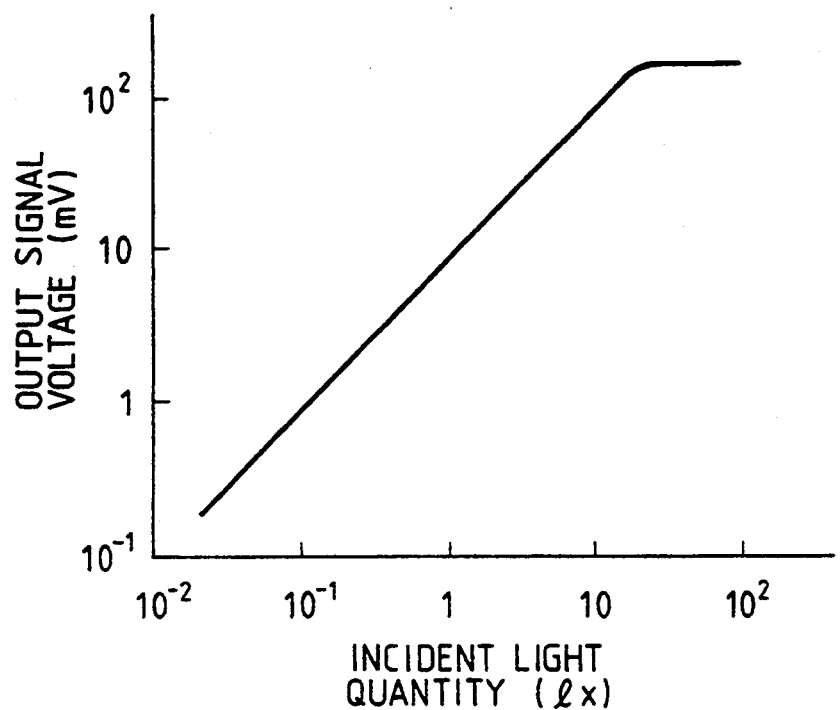
FIG. 14 is a diagram showing a photoelectric conversion characteristic of the solid state image sensor in the third embodiment.
Figure 15:
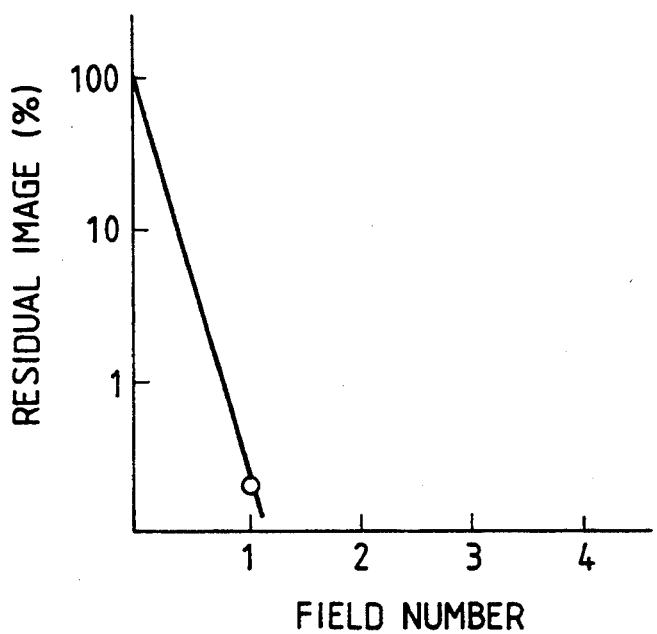
FIG. 15 is a diagram illustrating a residual image characteristic of the solid state image sensor in the third embodiment.

FIG. 14 shows a photoelectric conversion characteristic of the solid state image sensor in this embodiment constructed as shown above. In the embodiments of the present invention, the gain of the avalanche multiplication is set to 20. As can be understood from FIG. 14, a favorable rectilinearity of the photoelectric conversion characteristic is obtained. Further, FIG. 15 illustrates a residual image characteristic in the solid state image sensor in the thus constructed embodiment. As can be comprehended from FIG. 15, the residual image is restrained to be extremely small.

[Embodiment 4]

Next, an embodiment 4 of the present invention will be demonstrated with reference to the drawings.

Figure 16:
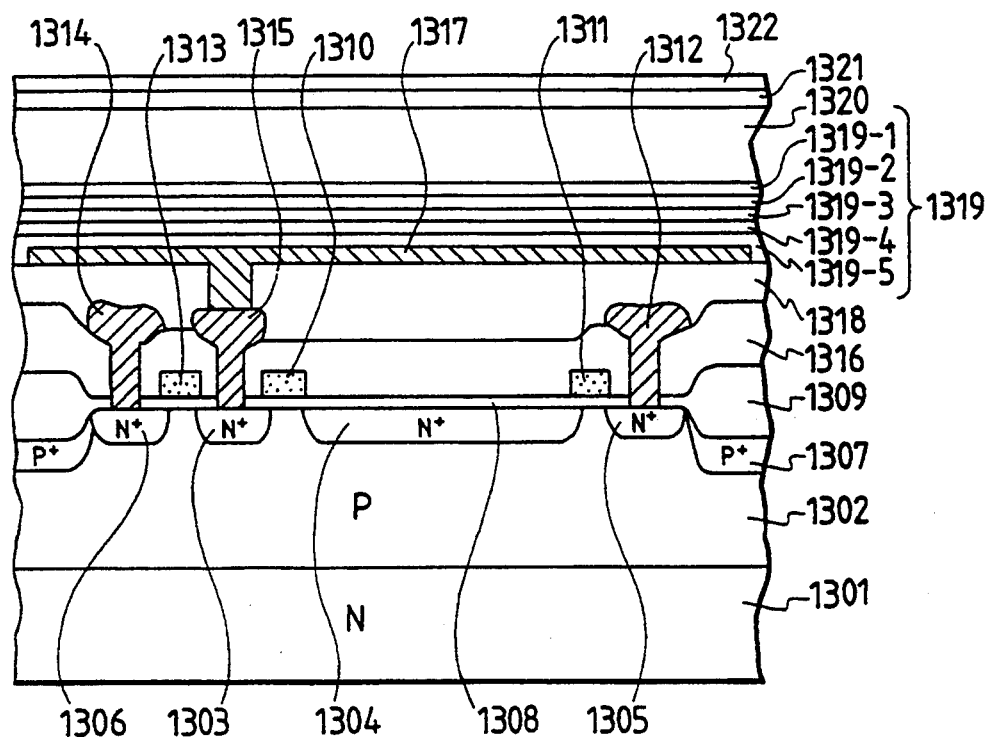
FIG. 16 is a schematic sectional view depicting an avalanche photodiode in a fourth embodiment of the present invention.

FIG. 16 is a sectional view of one pixel of the solid state image sensor in the fourth embodiment of this invention.

Turning to FIG. 16, the numeral 1301 denotes an N type silicon substrate; 1302 a P type well; 1303 an N+ type impurity semiconductor area for forming an APD; 1304 an N+ type impurity semiconductor area for forming a capacitor for storing avalanche-multiplied carriers; 1305 an N+ type drain for reading a signal carrier; 1306 an N+ type drain for fixing a potential of the N+ type impurity semiconductor area 1303 of the APD; 1307 a P+ type channel stop; 1308 a gate oxide film of a MOS transistor; 1309 a selective oxide area for effecting an element separation; 1310 a control gate electrode for keeping constant a voltage applied to the APD; 1311 a gate electrode for giving pulses for reading the signal carriers stored in the N+ type impurity semiconductor area 1304 for forming the storage capacitor; 1312 an electrode for fetching the signal carrier; 1313 a gate electrode for giving a pulse for fixing the potential of the N+ type impurity semiconductor area 1303 of the APD; 1314 an electrode to which the fixed voltage $V_R$ is applied; 1315 an electrode for leading the avalanche-multiplied signal carrier to the N+ type impurity semiconductor area 1303; 1316 an inter-layer ,insulating film interposed between the gate electrodes 1310, 1311, 1313 and the electrodes 1312, 1314, 1315; 1317 a pixel electrode provided per pixel; 1318 an inter-layer insulating film interposed between the electrodes 1312, 1314, 1315 and the electrode 1317; 1319 an avalanche multiplication area constructed to sequentially laminate five layers 1319-1, 1319-2, 1319-3, 1319-4, 1319-5 that are modulated to augment a band gap from a layer-upward direction to a layer-downward direction by changing a composition ratio of germanium and carbon from amorphous silicon germanium to amorphous silicon carbide; 1320 a light receiving layer, composed of an I type amorphous silicon, for leading the carriers generated by photoelectrically converting the incident light to the avalanche multiplication area 1319; 1321 a P+ type amorphous silicon layer; and 1322 a transparent electrode.

In the solid state image sensor in accordance with this embodiment, as in the same way with the embodiment 3 shown in FIG. 12, the pixels are two-dimensionally arrayed and operated.

The operation of the solid state image sensor in this embodiment will hereafter be explained.

The N+ type silicon substrate 1301 is held at 0 V. The transparent electrode 1322 for setting the potential of the P+ type impurity semiconductor area 1321 of the APD is held at a proper negative potential sufficient to cause the avalanche multiplication. A proper positive voltage $V_G$ sufficient to keep substantially constant a channel potential of the MOS transistor is applied to the control gate electrode 1310 for controlling the potential of the N+ type impurity semiconductor area 1303 of the APD. The positive voltage $V_R$ is applied to the electrode 1314. Applied to the electrode 1312 is the proper positive voltage $V_V$ higher than $V_G$ sufficient to keep the MOS transistor invariably in the ON state and to read/reset the photo signal from the N+ impurity semiconductor area 1304 for forming the storage capacitor.

The read/reset operations are performed absolutely in the same manner with the embodiment 3 shown in FIG. 13 (A).

During the next avalanche multiplication storage period, the incident light undergoes a photoelectric conversion through the light receiving layer 1320. The holes reach the P+ type amorphous silicon layer 1321 and are absorbed therein. The electrons are multiplied in the avalanche multiplication area 1319. The electrons are, after passing through the N+ type impurity semiconductor area 1303 and the channel area under the gate electrode 1310, stored in the N+ type impurity semiconductor area 1304 for forming the storage capacitor. A potential of the amorphous layers laminated at this moment is always kept constant. The photo carriers which have been generated and multiplied are led to the N+ type impurity semiconductor area 1304 of the storage capacitor without being substantially stored in the N+ type impurity semiconductor area 1303. Hence, the gain of the avalanche multiplication does not change. The avalanche-multiplied signal carriers stored in the N+ type impurity semiconductor area 1304 are outputted through the electrode 1312 in the same way with the embodiment 3 shown in FIG. 11.

The photoelectric conversion characteristic of the solid state image sensor in this constructed embodiment constructed as shown above exhibits a good rectilinearity as similarly illustrated in the characteristic diagram of FIG. 14 in the embodiment 3. Further, the light receiving part and the avalanche multiplication part are formed in lamination in this embodiment. Hence, an allowance in terms of area is provided. A capacitance value of the storage capacitor can be set large. A dynamic range becomes wider than that shown in FIG. 14. Besides, according to the characteristic of the present embodiment, the residual image can be also restrained to be extremely small as similar to the characteristic diagram of FIG. 15 in the embodiment 3.

Note that the present invention is not limited to the embodiments 3 and 4 discussed above. For instance, the potential control means may be a field-effect transistor. Instead of the MOS transistor, a junction type field-effect transistor (JFET) and a static induction transistor (SIT) may be usable. The storage capacitor may involve the use of a MOS capacitor in place of the PN junction. The pixel switch for reading the signal carrier from the storage capacitor may involve the use of a bipolar transistor and the JFET as a substitute for the MOS transistor. Current reading may be available as a reading method in place of voltage reading. The pixels may be arrayed one-dimensionally instead of the two-dimensional array. The present invention may be embodied otherwise in many variant forms without departing from the scope of the invention.

As fully discussed above, in accordance with the embodiments 3 and 4, the potential applied to the APD can be kept constant without producing the residual image by the potential control means interposed between the light receiving part and the carrier storage part and by the potential fixing means for fixing the potential applied to the APD of the light receiving part for a constant period. The gain of the avalanche multiplication of the APD is held constant also during the carrier storage period. Hence, it is possible to obtain the solid state image sensor exhibiting an excellent rectilinearity of the photoelectric conversion characteristic, a high sensitivity and a high SN ratio.

[Embodiment 5]

Figure 17:
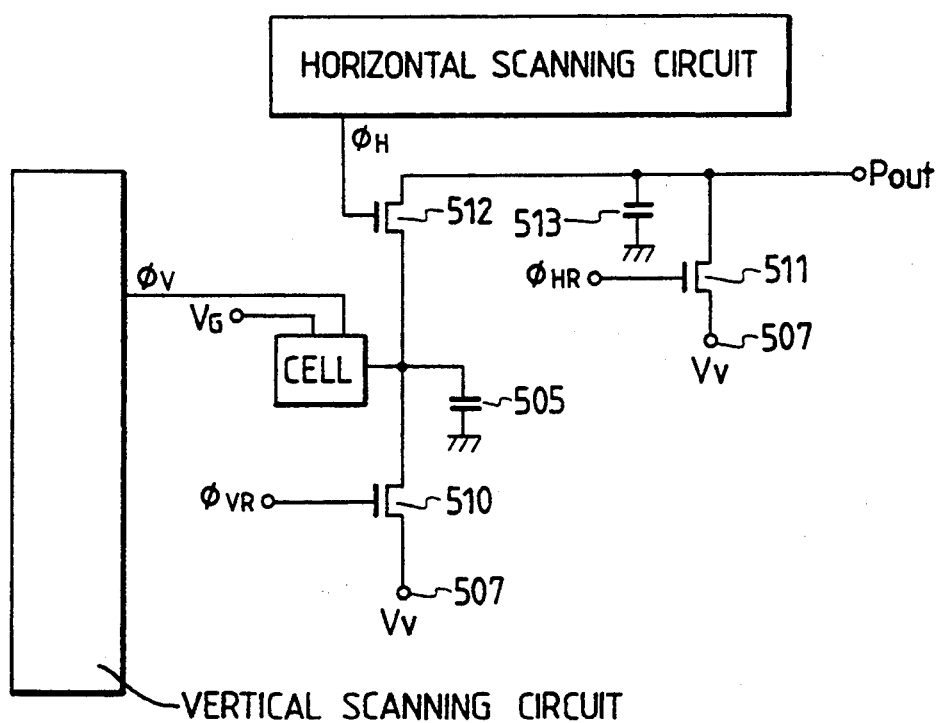
FIG. 17 is a block diagram showing a circuit of an avalanche photodiode in a fifth embodiment of the present invention.

FIG. 17 is a block diagram depicting a circuit of the solid state image sensor using the APD in a yet further embodiment of the present invention.

Figure 18:
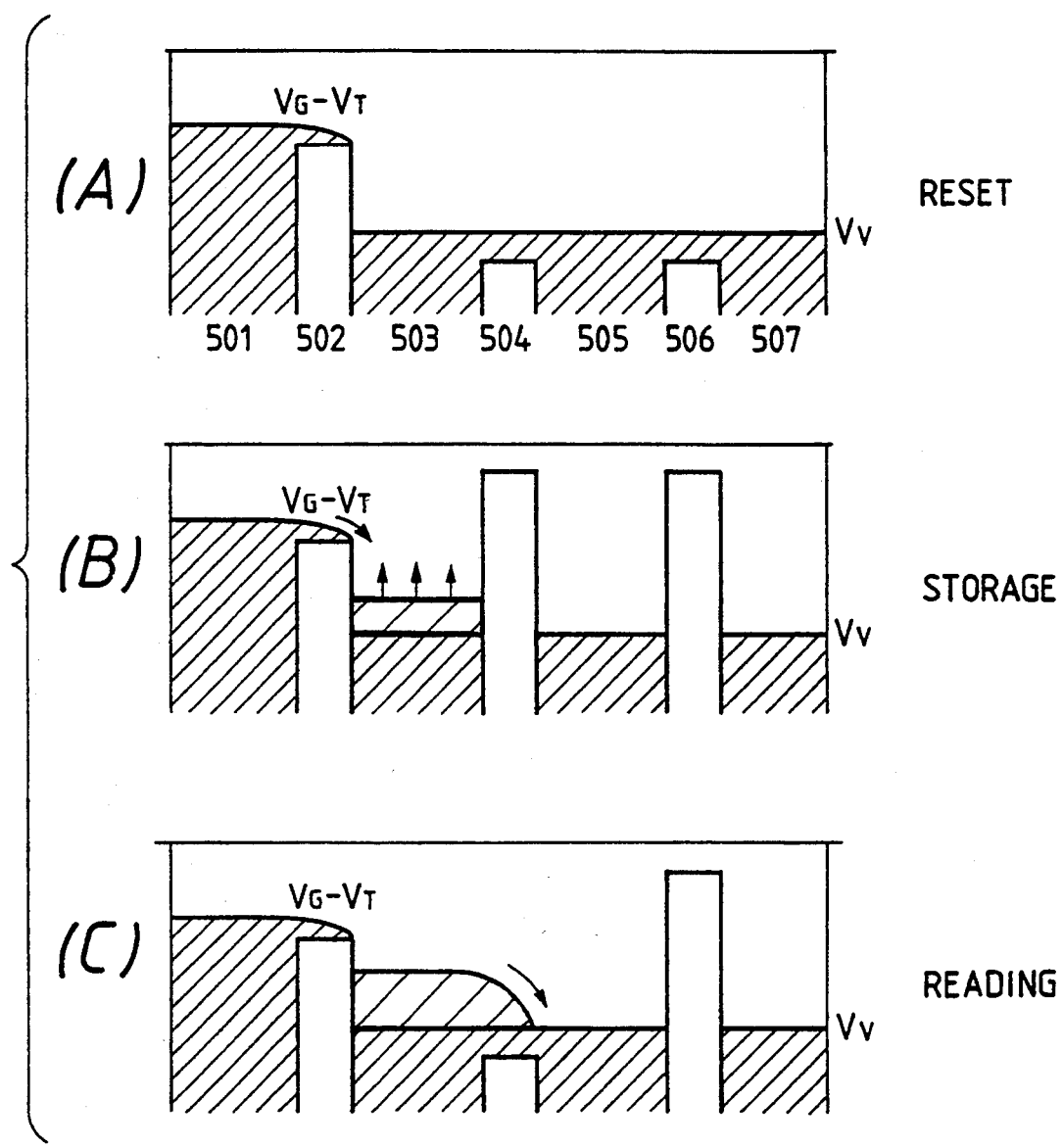
FIG. 18 is a schematic diagram of assistance in explaining the operation of the avalanche photodiode shown in FIG. 17, illustrating drive timings and potential profiles.
Figure 19:
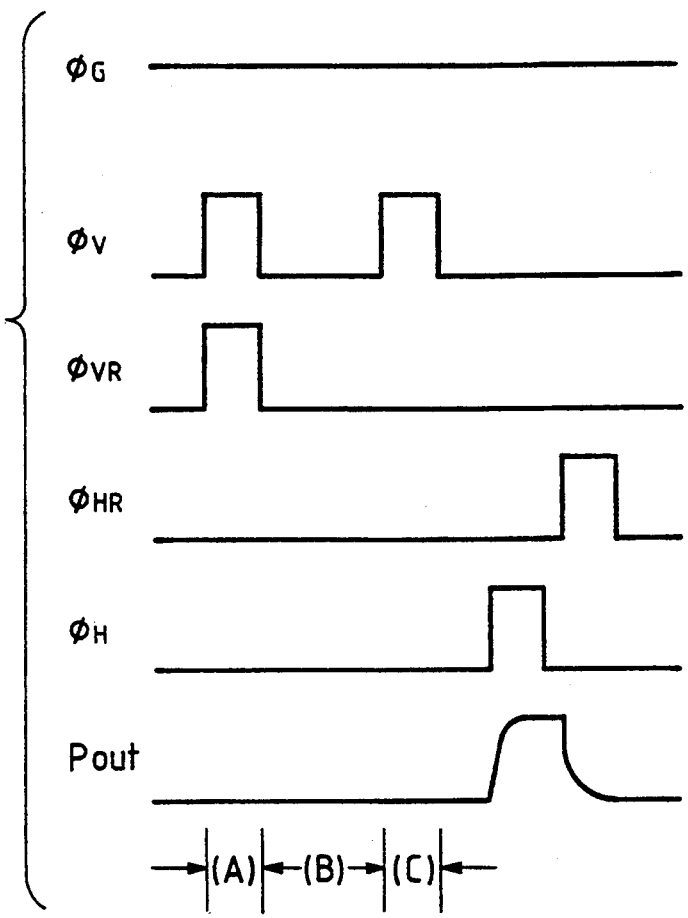
FIG. 19 is a timing chart of assistance in explaining the operation of the avalanche photodiode depicted in FIG. 17.

FIG. 18 is a schematic diagram illustrating profiles of respective portions. FIG. 19 is a timing chart for the circuit shown in FIG. 17.

A pixel CELL is, as in the same way with the embodiments 1 and 2 discussed above, composed of an APD 501, a carrier storage part 503, a potential control MOS gate 502 and a carrier transfer MOS gate 504. Alternatively, the pixel CELL is, as in the same way with the embodiments 3 and 4 discussed above, constructed of the APD 501, the carrier storage part 503, the potential control MOS gate 502, the carrier transfer MOS gate 504 and additionally an unillustrated reset transistor (corresponding to the numeral 25 in FIG. 12).

At the first onset, as shown in the reset operation (A) of FIG. 18, the MOS gate 504 and a MOS transistor 510 are turned ON. A potential between the carrier storage part 503 and a vertical line 505 is reset at a reference potential $V_V$ of a reference voltage source 507. This potential $V_V$ is well higher than a potential of a cathode of the APD 501.

Next, pulses $\phi_V$, $\phi_{VR}$ assume a LOW level. The MOS gate 504 and the MOS transistor 510 are brought into the OFF state. At this moment, as shown in a storage operation (B) of FIG. 18, the electrons of the carriers generated by the incident light on the APD 501 are stored in the carrier storage part 503 over a potential barrier of the MOS gate 502.

Subsequently, in a read operation (C) of FIG. 18, the pulse $\phi_V$ assuming a HIGH level is applied to the MOS gate 504. The carrier is read to a stray capacitor of the vertical line 505. Thereafter, the MOS transistor 504 is turned OFF, whereas the MOS transistor 512 is turned ON by a pulse $\phi_H$ assuming the HIGH level. The carrier of the vertical line 505 is read to a capacitor of a horizontal line 513.

Thus, the signal exhibiting an excellent rectilinearity and a high SN ratio is obtained.

In the read operation in accordance with this embodiment, there may be adopted a variant form of such a type that a circuit is constructed by connecting a capacitor element larger than the capacitor 505 connected to the vertical line via still another MOS transistor, and the signal is read thereto.

Figure 20:
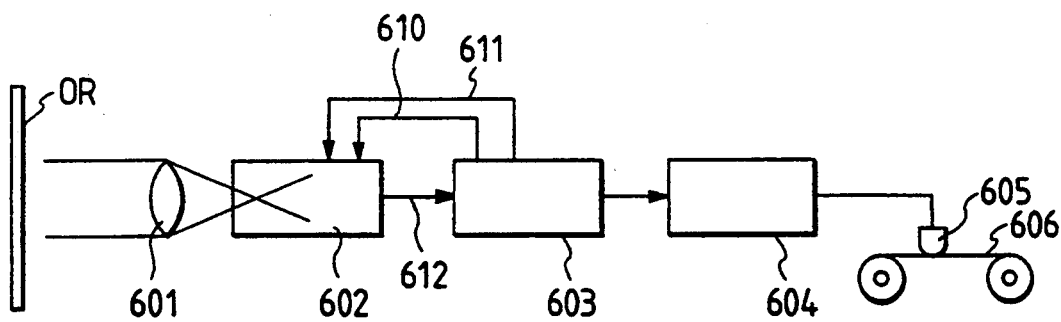
FIG. 20 is a block diagram showing one example of a signal processor including the avalanche photodiode according to the present invention.

FIG. 20 is a block diagram illustrating a construction of a signal processing system such as a communications system, a facsimile, a video recorder, etc. which use the APDs.

The symbol OR represents an original which carries image information or the like. The numeral 601 denotes an image forming lens; and 602 an APD according to the present invention.

As the APD, a simplex device may be adopted in the case of a simple communications system. A construction of a line sensor may be adopted in the case of the facsimile or the like. A construction of an area sensor is adopted in the case of the video recorder.

Designated at 603 is a control circuit including the central processing unit. The control circuit 603 is connected to the APD 602 via an output line 610 for driving the APD and a power supply line 611.

The numeral 604 indicates a record control circuit, connected to a recording head 605, for writing the information onto a recording medium 606.

The reading head 605 is a magnetic head in the case of the video recorder and a thermal head or an ink jet head in the case of the facsimile.

Then, in the case of the communications system, a recording device placed in a different location through a cable substitutes for the recording head 605.

According to the present invention described above, the potentials at both terminals of the APD become constant, and the strength of the electric field applied to the APD is held constant during the storage operation. Hence, the avalanche multiplication factor does not fluctuate, and the photoelectric conversion signal exhibiting the excellent rectilinearity is obtainable.

Further, the signal which shows the excellent rectilinearity and the large SN ratio is obtained. It is possible to simplify the construction for processing the signals and therefore provide the signal processor at a low price.

Although the illustrative embodiments of the present invention have been described in detail with reference to the accompanying drawings, it is to be understood that the present invention is not limited to those embodiments. Various changes or modification may be effected by one skilled in the art without departing from the scope or spirit of the invention.

What is claimed is:

1. An avalanche photodiode comprising:
    a light receiving part for producing an avalanche multiplication of photo carriers;
    a carrier storage part for storing photo carriers produced by an avalanche multiplication in said light receiving part;
    reading means for reading the photo carriers from said carrier storage part; and
    control means for controlling a first potential barrier between said light receiving part and said carrier storage part,
    wherein said control means first controls the first potential barrier to have a height greater than a height of a read potential barrier provided by said reading means for a reset operation, and then maintains the height of the first potential barrier while the height of the read potential barrier is made greater than the height of the first potential barrier, so that said light receiving part produces an avalanche multiplication of photo carriers to be stored in the carrier storage part, the height of the read potential barrier then being made lower than the height of the first potential barrier for performing a reading operation.

2. The avalanche photodiode as set forth in claim 1, wherein said control means comprises a field-effect transistor having a gate to which a constant voltage is applied.

3. The avalanche photodiode as set forth in claim 1, wherein said light receiving part is formed integrally within a semiconductor substrate formed with said carrier storage part, said reading means and said control means.

4. The avalanche photodiode as set forth in claim 1, wherein said light receiving part is laminated on said semiconductor substrate formed with said carrier storage part, said reading means and said control means.

5. An avalanche photodiode comprising:
    a light receiving part for producing an avalanche multiplication of photo carriers;
    a carrier storage part for storing photo carriers produced by an avalanche multiplication in said light receiving part;
    reading means for reading the photo carriers from said carrier storage part;
    control means for controlling a first potential barrier between said light receiving part and said carrier storage part; and
    fixing means for fixing a potential of said light receiving part,
    wherein said control means first controls the first potential barrier to have a height greater than a height of a read potential barrier provided by said reading means and greater than a potential provided by said fixing means for a reset operation, and then maintains the height of the first potential barrier while the height of the read potential barrier and the potential provided by said fixing means are made greater than the height of the first potential barrier, so that said light receiving part produces an avalanche multiplication of photo carriers to be stored in the carrier storage part, the height of the read potential barrier and the potential provided by said fixing means then being made lower than the height of the first potential barrier for performing a reading operation.

6. The avalanche photodiode as set forth in claim 5, wherein said control means comprises a field-effect transistor having a gate to which a constant voltage is applied.

7. The avalanche photodiode as set forth in claim 5, wherein said potential fixing means comprises a MOS transistor.

8. The avalanche photodiode as set forth in claim 5, wherein said light receiving part is formed integrally within a semiconductor substrate formed with said carrier storage part, said reading means, said control means and said potential fixing means.

9. The avalanche photodiode as set forth in claim 5, wherein said light receiving part is laminated on said semiconductor substrate formed with said carrier storage part, said reading means, said control means and said potential fixing means.

10. A signal processor comprising:
a plurality of avalanche photodiodes each comprising:
a light receiving part for producing an avalanche multiplication of photo carriers;
a carrier storage part for storing photo carriers produced by an avalanche multiplication in said light receiving part;
reading means for reading the photo carriers from said carrier storage part; and
control means for controlling a first potential barrier between said light receiving part and said carrier storage part,
wherein said control means first controls the first potential barrier to have a height greater than a height of a read potential barrier provided by said reading means for a reset operation, and then maintains the height of the first potential barrier while the height of the read potential barrier is made greater than the height of the first potential barrier, so that said light receiving part produces an avalanche multiplication of photo carriers to be stored in the carrier storage part, the height of the read potential barrier then being made lower than the height of the first potential barrier for performing a reading operation, and
wherein at least one of said avalanche photodiodes includes a shift register for driving said reading means.

11. The signal processor as set forth in claim 10, wherein said signal processor is an image sensor.

12. The signal processor as set forth in claim 10, wherein said signal processor is connected to a communications system.

13. The signal processor as set forth in claim 10, wherein said signal processor is mounted in a facsimile including a recording head.

14. The signal processor as set forth in claim 10, said signal processor is mounted in a video recorder including a magnetic head.

* * * * *

UNITED STATES PATENT AND TRADEMARK OFFICE
CERTIFICATE OF CORRECTION

PATENT NO. : 5,401,952
DATED : March 28, 1995
INVENTOR(S) : SHIGETOSHI SUGAWA

Page 1 of 2

It is certified that error appears in the above-identified patent and that said Letters Patent is hereby corrected as shown below:

ON THE TITLE PAGE

In [56] References Cited, "Yamanoto et al." should read --Yamanobe et al.--.

In [57] Abstract, "leader." should read --reader.--

COLUMN 2

Line 52, "characteristic" should read --characteristic that--.

COLUMN 4

Line 37, "Carrier" should read --carrier--.
Line 39, "set" should read --set to be--.
Line 40, "10" should be deleted.

COLUMN 6

Line 36, "$V_G$applied" should read --$V_G$ applied--.

COLUMN 9

Line 13, "with" should be deleted.

UNITED STATES PATENT AND TRADEMARK OFFICE
CERTIFICATE OF CORRECTION

PATENT NO. : 5,401,952
DATED : March 28, 1995
INVENTOR(S) : SHIGETOSHI SUGAWA

It is certified that error appears in the above-identified patent and that said Letters Patent is hereby corrected as shown below:

COLUMN 11

Line 10, "(c)." should read --(C).--.

COLUMN 18

Line 28, "said" should read --wherein said--.

Signed and Sealed this

Twenty-seventh Day of June, 1995

Attest:

BRUCE LEHMAN

Attesting Officer       Commissioner of Patents and Trademarks